US011287556B2

(12) United States Patent
Zhang et al.

(10) Patent No.: US 11,287,556 B2
(45) Date of Patent: Mar. 29, 2022

(54) BACKLIGHT MODULE AND DISPLAY DEVICE

(71) Applicant: WUHAN CHINA STAR OPTOELECTRONICS TECHNOLOGY CO., LTD., Wuhan (CN)

(72) Inventors: Peng Zhang, Wuhan (CN); Chao Wang, Wuhan (CN); Guanghui Liu, Wuhan (CN); Yantao Lu, Wuhan (CN)

(73) Assignee: Wuhan China Star Optoelectronics Technology Co., Ltd., Wuhan (CN)

(*) Notice: Subject to any disclaimer, the term of this patent is extended or adjusted under 35 U.S.C. 154(b) by 136 days.

(21) Appl. No.: 16/620,166

(22) PCT Filed: Oct. 15, 2019

(86) PCT No.: PCT/CN2019/111261
§ 371 (c)(1),
(2) Date: Dec. 6, 2019

(87) PCT Pub. No.: WO2020/211310
PCT Pub. Date: Oct. 22, 2020

(65) Prior Publication Data
US 2021/0341662 A1 Nov. 4, 2021

(30) Foreign Application Priority Data
Apr. 15, 2019 (CN) .......................... 201910300899.1

(51) Int. Cl.
*F21V 8/00* (2006.01)
*G02F 1/1345* (2006.01)
*G02F 1/136* (2006.01)

(52) U.S. Cl.
CPC ........... *G02B 6/002* (2013.01); *G02B 6/0043* (2013.01); *G02B 6/0061* (2013.01); *G02B 6/0088* (2013.01); *G02F 1/136* (2013.01); *G02F 1/13452* (2013.01); *G02F 1/13458* (2013.01)

(58) Field of Classification Search
CPC ..... G02B 6/002; G02B 6/0043; G02B 6/0061
See application file for complete search history.

(56) References Cited

U.S. PATENT DOCUMENTS

2013/0335674 A1* 12/2013 Hu ....................... G02B 6/0013
349/64
2014/0119056 A1* 5/2014 Chang ................... G02B 6/0036
362/625

FOREIGN PATENT DOCUMENTS

CN 108885371 A * 11/2018 ......... G02F 1/13357
TW 201122575 A * 7/2011 ............... G02B 6/00

* cited by examiner

Primary Examiner — Donald L Raleigh

(57) ABSTRACT

A backlight module and a display device, by disposing backlight concave sections on a light source lateral side of a back frame in the backlight module, the backlight concave sections and panel concave sections on a display panel correspond to one another. During assembling, part of sections of a flexible electric circuit board is bent to back of the backlight module through an edge of the panel concave section and the backlight concave sections to reduce a size of a bottom bezel of the display device, which improves the screen-to-body ratio of the display device.

20 Claims, 19 Drawing Sheets

BACKLIGHT MODULE AND DISPLAY DEVICE

FIELD OF INVENTION

The present disclosure relates to a field of display technology, and particularly to a backlight module and a display device.

BACKGROUND OF INVENTION

With development of full-screen technology, a screen-to-body ratio of display screens is continuously increasing, area of non-display region of displays (such as a bottom bezel) is getting smaller and smaller, and a distance between the bottom bezel and an edge of the display region is continuously decreasing. Correspondingly, area of light source configuration area (such as a bottom bezel) of backlight modules is also getting smaller and smaller, and a distance between a light guide plate and a backlight module is continuously decreasing.

Because it is necessary to dispose circuit elements such as lateral light sources, light source driving chips, traces, terminals, etc. in the light source configuration area. In order to ensure normal functions of these circuit elements, it is necessary to reserve sufficient area such as a distance between a light guide plate and a bezel of the backlight module should not be less than a predetermined value. Therefore, configuration of current backlight modules cannot meet the development trend of full-screen technology.

That is, current backlight modules have the technical problem that current backlight modules cannot meet the development trend of full-screen technology, and needs improvement.

SUMMARY OF INVENTION

The present disclosure provides a backlight module and a display device to solve the technical problem that current backlight modules cannot meet the development trend of full-screen technology.

In order to solve the problems mentioned above, the present disclosure provides the technical solutions as follows:

Embodiments of the present disclosure provide a backlight module, which include:

a back frame including a light source lateral side for disposing a lateral light source, and a confining lateral side; the light source lateral side and the confining lateral side surrounding to form an accommodating chamber; a light guide plate disposed in the accommodating chamber, and a light incident surface of the light guide plate corresponding to the light source lateral side; the lateral light source disposed between the light source lateral side and the light guide plate; and at least two backlight concave sections formed on the light source lateral side.

In the backlight module provided by an embodiment of the present disclosure, a width of the backlight concave sections is 1% to 50% of a width of the back frame.

In the backlight module provided by an embodiment of the present disclosure, a plurality of protruding sections are disposed on an edge of the light guide plate close to the backlight concave sections, and a location where the protruding sections disposed corresponds to the backlight concave sections.

In the backlight module provided by an embodiment of the present disclosure, the protruding sections include an edge, and a first oblique surface and a second oblique surface which are connected to two ends of the edge; a first included angle formed between the first oblique surface and the light incident surface of the light guide plate is a non-sharp angle; a second included angle formed between the second oblique surface and the light incident surface of the light guide plate is a non-sharp angle.

In the backlight module provided by an embodiment of the present disclosure, the edge of the protruding sections is a straight-line shape or a circular shape.

In the backlight module provided by an embodiment of the present disclosure, a plurality of grid dots are disposed on the light guide plate, a density of the grid dots in a region where the protruding sections correspond to is greater than other region.

In the backlight module provided by an embodiment of the present disclosure, the back frame includes a plastic frame, or a plastic-iron integrated frame.

In the backlight module provided by an embodiment of the present disclosure, at least two of the backlight concave sections separate the light source lateral side into at least three bulge sections, and the lateral light source includes a light source module located in, on, or in and on the bulge sections.

In the backlight module provided by an embodiment of the present disclosure, a third included angle formed between a light-existing direction of a light source which is close to a region of the backlight concave sections in the light source module and the light incident surface of the light guide plate is a sharp angle.

In the backlight module provided by an embodiment of the present disclosure, the third included angle ranges from 0 degree to 45 degrees.

Meanwhile, embodiments of the present disclosure provide a display device, which includes the backlight module provided by the present disclosure, and a display panel; the display panel includes an array substrate, a driving chip and a flexible electric circuit board; the array substrate includes a display region and a non-display region; the driving chip and the flexible electric circuit board are bonded on a side of the non-display region; at least two bumps are formed on a side of the non-display region away from the display region, and a panel concave section is formed between the adjacent bumps; the panel concave sections correspond to the backlight concave sections of the backlight module; part of sections of the flexible electric circuit board are bent to back of the backlight module through an edge of the panel concave section and the backlight concave sections.

In the display device provided by an embodiment of the present disclosure, a bending apex of the flexible electric circuit board is located in the panel concave section and the backlight concave sections.

In the display device provided by an embodiment of the present disclosure, the bumps include at least one first bump, and at least one second bump, and the driving chip is located between an edge of the first bump and an edge of the display region.

In the display device provided by an embodiment of the present disclosure, the driving chip is located out of the first bump; or the driving chip is completely or partially disposed in the first bump.

In the display device provided by an embodiment of the present disclosure, a shape of the bumps includes one or several of a rectangular shape, a trapezoidal shape, a circular arc shape, or a triangular shape.

In the display device provided by an embodiment of the present disclosure, a gate on array (GOA) trace is disposed inside the array substrate, and the GOA trace includes an oblique section located in the non-display region and directed to the driving chip, the oblique section of the GOA trace is connected to the driving chip; a plurality of signal terminal groups is disposed inside the non-display region for connecting to the flexible electric circuit board.

In the display device provided by an embodiment of present disclosure, the signal terminal group includes a major signal terminal set and a sub signal terminal set, and the major signal terminal set is located between the sub signal terminal set and the driving chip.

In the display device provided by an embodiment of the present disclosure, the sub signal terminal set and the major signal terminal set are spaced apart, and the major signal terminal set is completely or partially located in the first bump, the sub signal terminal set is located out of the first bump.

In the display device provided by an embodiment of the present disclosure, the flexible electric circuit board includes a major section and a connection section, the connection section includes a first block correspondingly connected to the major signal terminal set, and a second block correspondingly connected to the sub signal terminal set; the first block and the second block are disposed in stagger.

In the display device provided by an embodiment of the present disclosure, the signal terminal group further includes a virtual terminal group, the virtual terminal group is located on a side of the sub signal terminal set away from the driving chip and the oblique section of the GOA trace.

The beneficial effect of the present disclosure is that the present disclosure provides a backlight module and a display device. By disposing the backlight concave sections on the light source lateral side of the back frame in the backlight module, the backlight concave sections and the panel concave section on the display panel correspond to each other. During assembling, part of sections of the flexible electric circuit board bent to back of the backlight module through the panel concave section of at least a side of the bumps and an edge of the backlight concave sections to reduce a size of the bottom bezel of the display device, which improves the screen-to-body ratio of the display device, enhances the differentiated performance of the product, and improve market competitiveness of the product.

DESCRIPTION OF DRAWINGS

To more clearly illustrate embodiments or the technical solutions of the present disclosure, the accompanying figures of the present disclosure required for illustrating embodiments or the technical solutions of the present disclosure will be described in brief. Obviously, the accompanying figures described below are only part of the embodiments of the present disclosure, from which figures those skilled in the art can derive further figures without making any inventive efforts.

DETAILED DESCRIPTION OF PREFERRED EMBODIMENTS

The descriptions of embodiments below refer to accompanying drawings in order to illustrate certain embodiments which the present disclosure can implement. The directional terms of which the present disclosure mentions, for example, "top," "bottom," "upper," "lower," "front," "rear," "left," "right," "inside," "outside," "side," etc., are just refer to directions of the accompanying figures. Therefore, the used directional terms are for illustrating and understanding the present disclosure, but not for limiting the present disclosure. In the figures, units with similar structures are used same labels to indicate.

Figure 1:
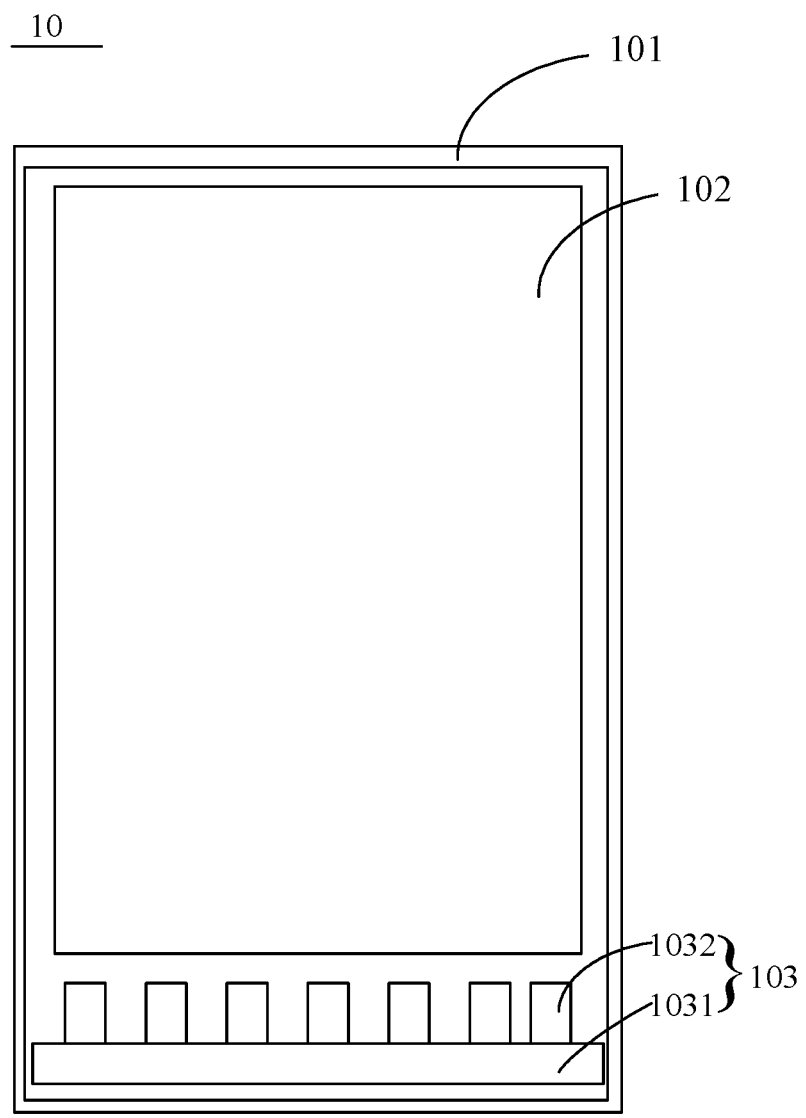
FIG. 1 is a structural schematic diagram of a current backlight module.
Figure 2:
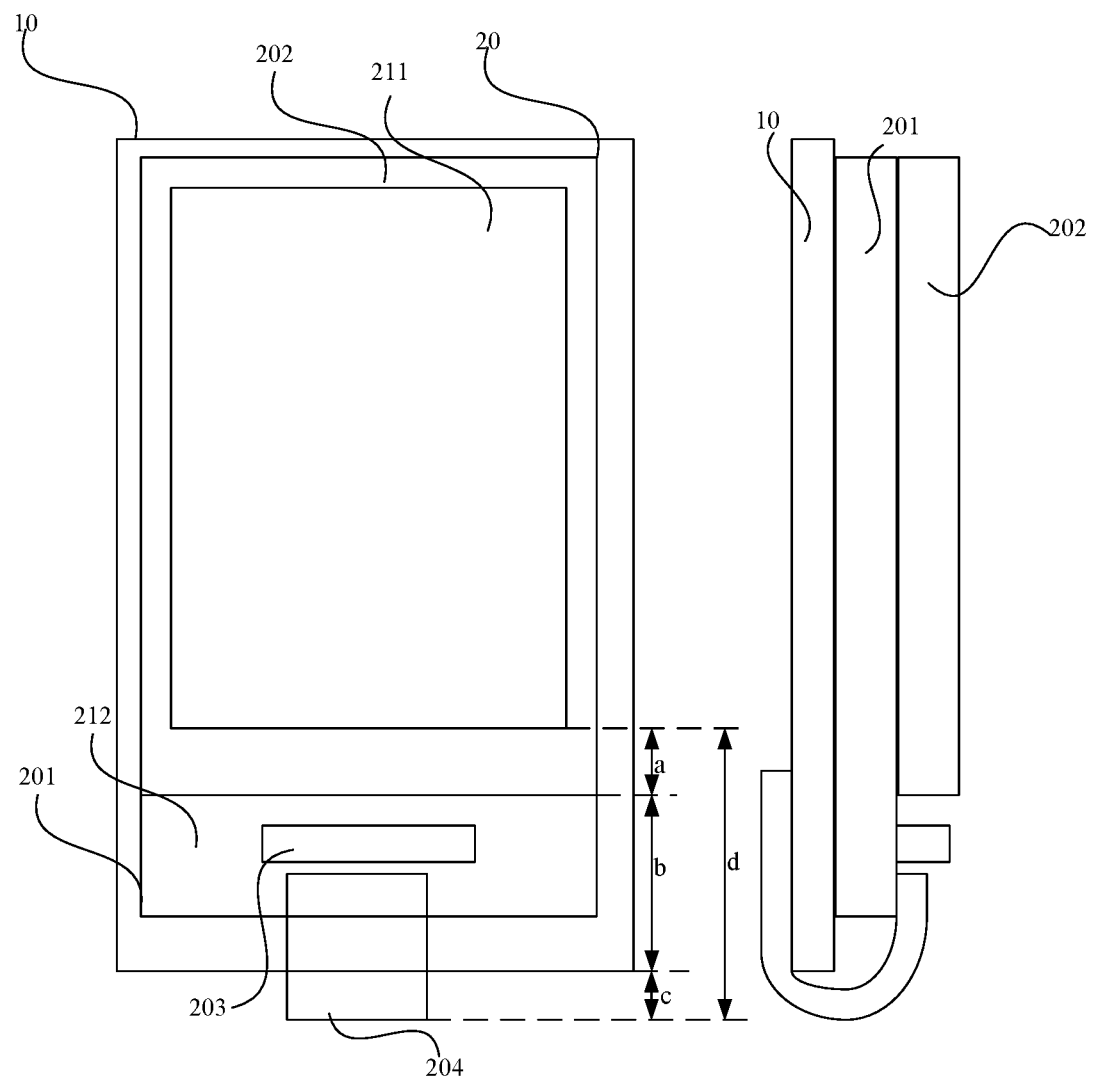
FIG. 2 is a dimension schematic diagram of a current backlight module.

As illustrated in FIG. 1 and FIG. 2, a current backlight module 10 includes a back frame 101, a light guide plate 102, a lateral light source 103 (including a circuit board 1031 and a light emitting diode (LED) light 1032). A display device includes the backlight module 10 and a display panel 20. The display panel 20 includes an array substrate 201, a color film substrate 202 disposed opposite the array substrate 201, a driving chip 203 disposed on the array substrate 201, and a flexible electric circuit board 204 bonded to the array substrate 201. The array substrate 201 includes a display region 211, and a non-display region 212 adjacent to the display region 211. A height d of the bottom bezel of the display device is a distance from the bottom edge of the display region 211 to the bottom edge of the display device is a sum of a distance a between the display region 211 and a visible region of the backlight module 10 (generally aligned with an edge of the color film substrate 202), a distance b between the visible region of the backlight module 10 and a bottom edge of the backlight module 10, and a distance c between the bottom edge of the backlight module 10 and the bottom edge of the display device (generally same as the edge of the flexible electric circuit board 204), which is d=a+b+c.

In prior art, the bottom edge of the display device becomes narrow mainly by increasing an arrangement density of the lateral light source 103 to reduce the light mixing distance, that is, by reducing the value of the distance b between the visible region of the backlight module 10 and the edge of the backlight module 10 to increase the screen-to-body ratio. However, as the bottom bezel gets narrower and narrower, the arrangement space of the lateral light source 103 becomes limited and the arrangement density of the lateral light source 103 cannot be increased. As a result, the size of the bottom bezel d of the display device cannot become smaller by increasing the arrangement density of the lateral light source 103, thereby the screen-to-body ratio cannot be increased.

The present disclosure addresses the technical problem of the backlight modules and the display devices of prior art, that is, with the bottom bezel getting narrower and narrower, the arrangement space of the light source becomes limited and the arrangement density of light source cannot be increased, which results in not being able to make the size of the bottom bezel of the display device narrower by increasing the arrangement density of the light source. The embodiments of the present disclosure can solve the technical problem.

Figure 3:
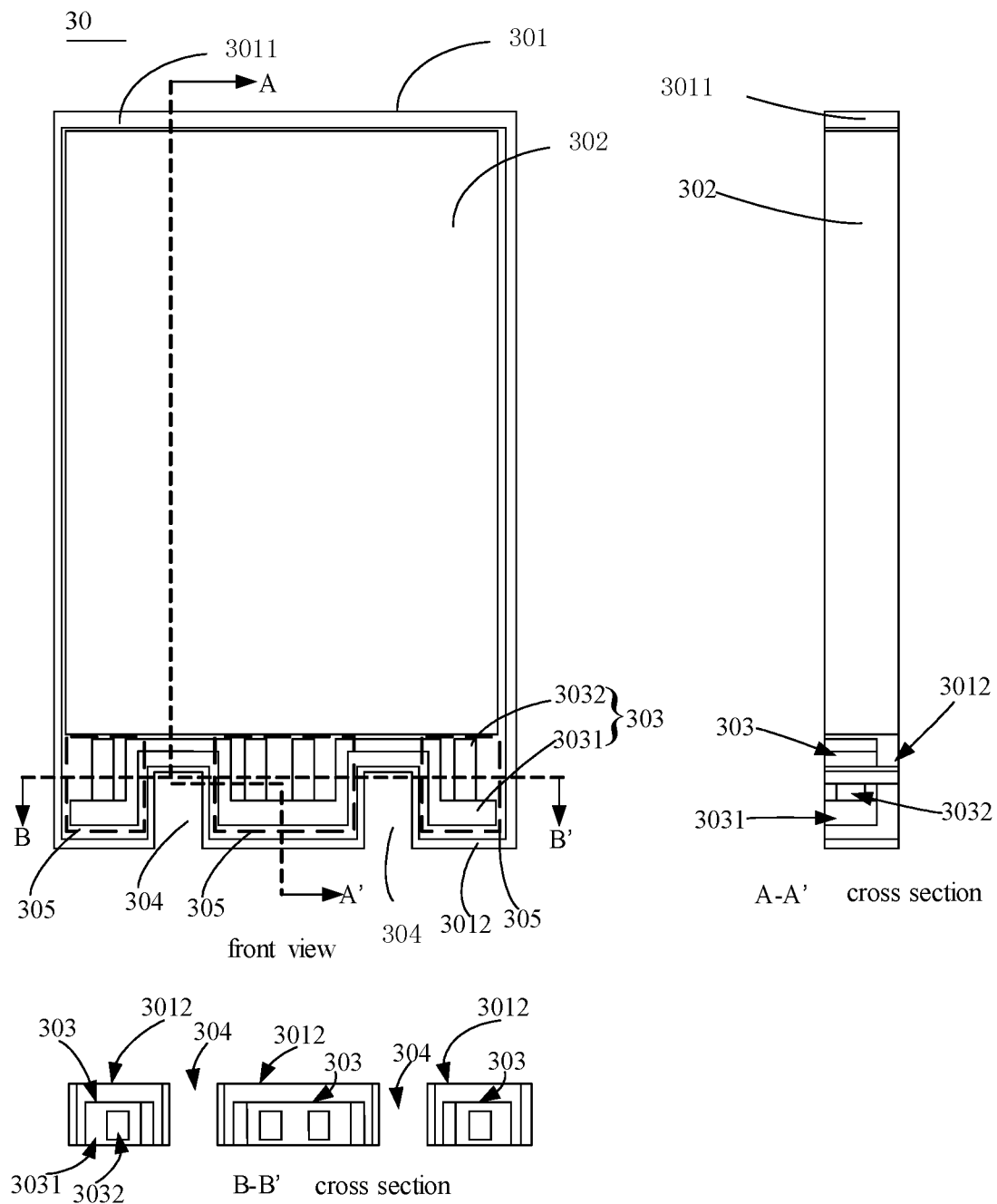
FIG. 3 is a structural schematic diagram of a backlight module provided by an embodiment of the present disclosure.

In an embodiment, as illustrated in FIG. 3, the backlight module 30 provided by the present disclosure includes:

a back frame 301, including a plurality of confining lateral sides 3011 and at least one of which is for confining, and at least one light source lateral side 3012 for disposing a lateral light source, and the light source lateral side 3012 and the confining lateral side 3011 surrounds to form an accommodating chamber; a light guide plate 302 disposed in the accommodating chamber, and a light incident surface of the light guide plate 302 corresponding to the light source lateral side 3012; a lateral light source 303 including a circuit 3031 and a light source 3032 such as a light emitting diode (LED) light, and the lateral light source 303 disposed between the light source lateral side 3012 of the back frame 301 and the light guide plate 302, that is, located in the accommodating chamber; the light source lateral side 3012 of the back frame 301 corresponds to a light incident surface of the light guide plate 302, and a light emitting direction of the light source 3032 is toward the light incident surface of the light guide plate 302.

Further, at least two backlight concave sections 304 are formed on the light source lateral side 3012 of the back frame 301.

In an embodiment, the back frame 301 includes a plastic frame, a plastic-iron integrated frame, and other embodiments.

In an embodiment, when the back frame 301 is a plastic-iron integrated frame, the plastic-iron integrated frame includes a bottom plate and a surrounding lateral side, and the bottom plate and the lateral side form an accommodating chamber. At this time, it is necessary to form at least two backlight concave sections 304 on the light source lateral side 3012. It is necessary to simultaneously perform a process at the location on the bottom plate corresponding to the backlight concave sections 304 to form a groove, so that the present disclosure can be realized. In this embodiment, the backlight module is independent of other functional units of the display device, and a reflective sheet is first placed on the bottom plate in the accommodating chamber, and then the light guide plate is placed on the reflective sheet and located in the accommodating chamber.

In an embodiment, when the back frame 301 is a plastic frame, the plastic frame includes a surrounding lateral side to form an accommodating chamber, and the plastic frame does not include a bottom plate. At this time, it is only necessary to form at least two backlight concave sections 304 on the light source lateral side 3012 to realize the present disclosure. In this embodiment, the plastic frame of the backlight module is fixed on other functional units of the display device, and the reflective sheet is first placed on the bottom plate in the accommodating chamber, and then the light guide plate is placed on the reflective sheet and located in the accommodating chamber.

In an embodiment, as illustrated in FIG. 3, a shape of the backlight concave sections 304 is a rectangular shape or a U-shape, which can be determined according to process conditions or display device configuration requirements.

In an embodiment, a width of the backlight concave sections 304 is 1% to 50% of a width of the bottom plate. In one aspect, the width of the backlight concave sections 304 is required to allow the flexible electric circuit board to pass through the backlight concave sections 304 and be bent, and on the other hand, a sufficient space can be left for a light source placement region to place the lateral light source, so that the backlight module can provide light strong enough for the display panel.

In an embodiment, at least two of the backlight concave sections 304 separate the light source lateral side of the back frame into at least three bulge sections 305; the lateral light source 303 includes a light source module located in and/or on the bulge sections.

In an embodiment, the lateral light source 303 is located in the bulge sections 305, and at this time, the bulge sections 305 form a light source placement region.

Figure 4:
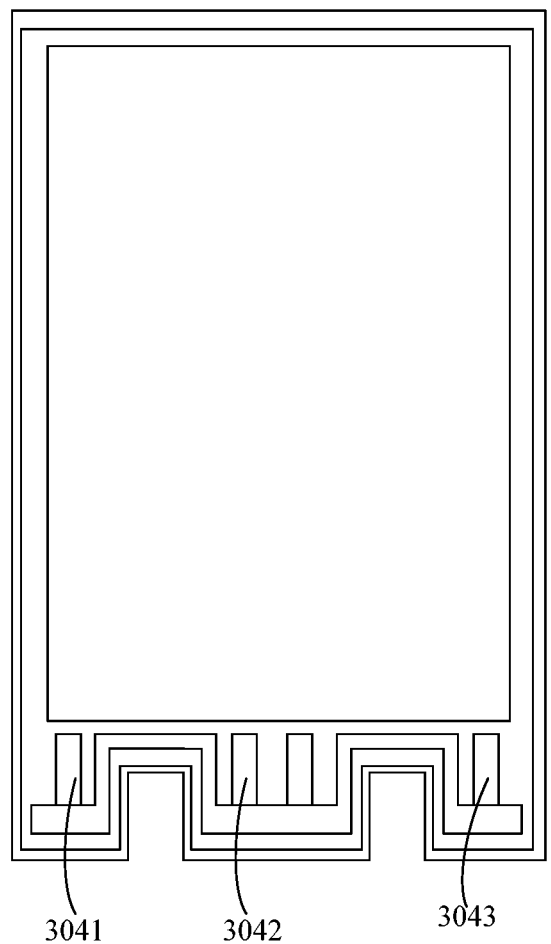
FIG. 4 is a first schematic diagram of a light guide plate provided by an embodiment of the present disclosure.

In an embodiment, as illustrated in FIG. 4, the lateral light source 303 includes a light source module located in the light source placement region; the light source module includes a first light source set 3031, a second light source set 3032, and a third light source set 3033; the first light source set 301, the second light source set 3032, and the third light source set 3033 are driven by a same circuit board for uniformly driven light emission.

In an embodiment, the first light source set 3031, the second light source set 3032, and the third light source set 3033 can be driven to emit light respectively by three circuit boards for saving electrical energy.

In an embodiment, as illustrated in FIG. 4, a shape of the light guide plate 302 is a rectangular shape; the first light source set 3031 and the third light source set 3033 are respectively disposed on two sides of the light guide plate 302, and the second light source set 3032 is disposed in a middle position of the light guide plate 302 and is respectively disposed opposite part of a region of the light incident surface of the light guide plate 302; the light emitted from the first light source set 301, the second light source set 3032, and the third light source set 3033 enters the region.

Figure 5:
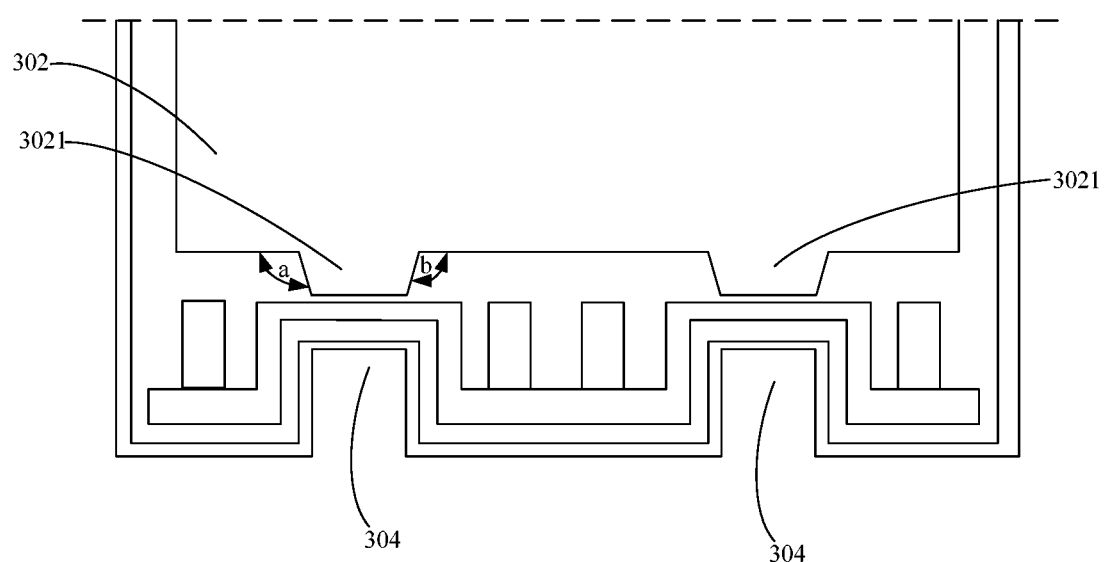
FIG. 5 is a second schematic diagram of a light guide plate provided by an embodiment of the present disclosure.

In an embodiment, as illustrated in FIG. 5, a plurality of protruding sections 3021 are disposed on an edge of the light guide plate 302 close to the backlight concave sections (that is the light incident surface), and a location where the protruding sections 3021 are disposed corresponds to the backlight concave sections 304; the protruding sections 3021 may not have the optical characteristics of the light incident surface, and is only used for fixing the light guide plate in the bottom plate.

In an embodiment, as illustrated in FIG. 5, the protruding sections 3021 include an edge, and a first oblique surface and a second oblique surface, which are connected to two ends of the edge; a first included angle a formed between the first oblique surface and the light incident surface of the light guide plate is a non-sharp angle; a second included angle b formed between the second oblique surface and the light incident surface of the light guide plate is a non-sharp angle. The first included angle a ranges from 90° to 135°, and the second angle b ranges from 90° to 135°, so that the light emitted from the first light source set 3031, the second light source set 3032, and the third light source set 3033 enters the protruding sections 3021. As a result, the light emitted by the first light source set 3031, the second light source set 3032, and the third light source set 3033 and entered the light guide plate 32 is distributed uniformly, achieving great optical quality.

In an embodiment, degrees of the first included angle and the second included angle can be the same or different.

In an embodiment, the edge of the protruding sections 3021 is a straight-line shape or an arc circular shape, and can be configured according to requirements.

The light guide plate is primarily made of an optical grade acrylic plate, etc. A high-tech material having a very high reflectivity and with no light absorption is used. On a bottom surface of the acrylic plate, applying laser engraving technique and such printing technique to print aa plurality of light guiding points by, and the light guiding points are also known as grid dots. When using the acrylic plate, the optical grade acrylic plate is primarily used to absorb light from the light source and keep the light on the surface of the optical grade acrylic plate. When the light hits each of the grid dots, the reflected light will diffuse to various angles, and then emit from the front side of the light guide plate.

Figure 6:
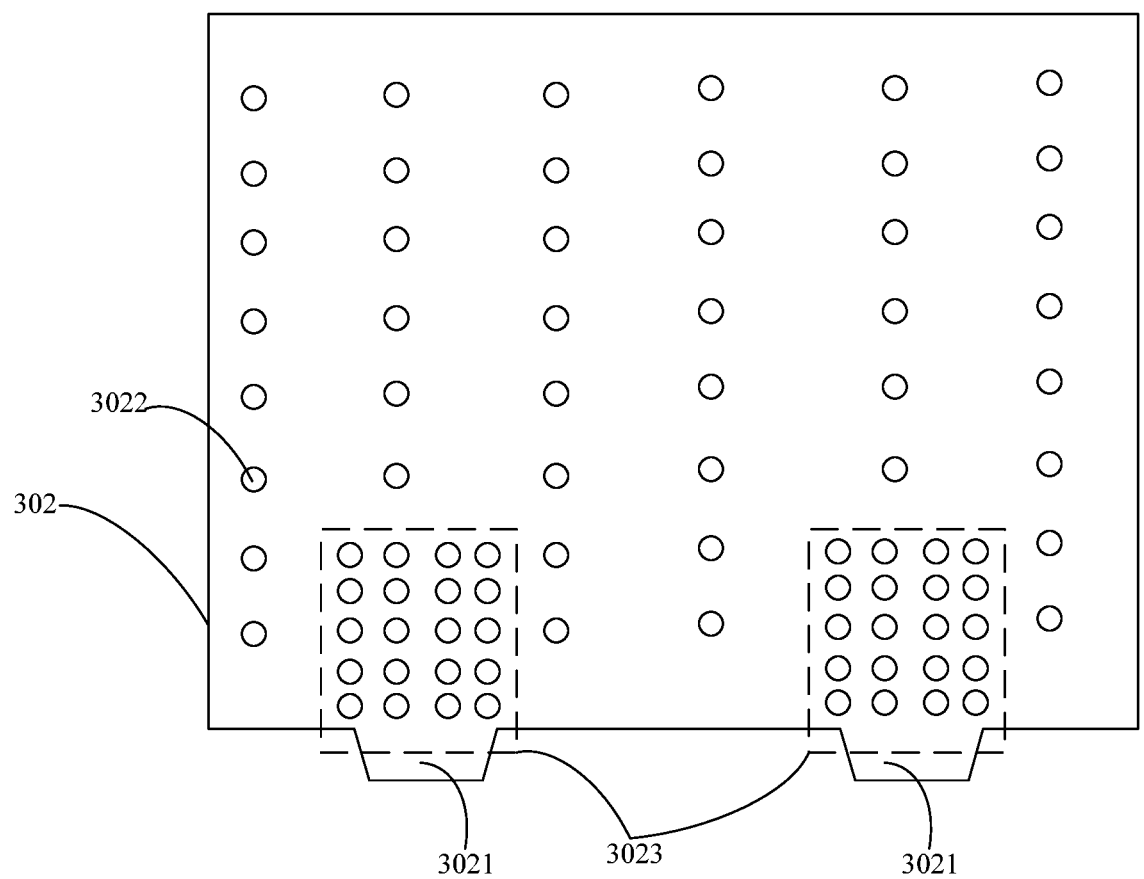
FIG. 6 is a third schematic diagram of a light guide plate provided by an embodiment of the present disclosure.

Because there are concave structures such as the backlight concave sections on the backlight module, correspondingly, a pitch of the lateral light source such as the LEDs of the backlight concave sections is larger than other positions, so that the incident light entering the region is relatively less. Therefore, in an embodiment, as illustrated in FIG. 6, the grid dots 3022 are disposed on a bottom surface of the light guide plate 302; a density of the grid dots 3022 in the region 3023 where the protruding sections 3021 correspond to (including a front region and a middle region of the protruding sections 321) is greater than other region, so that brightness of the region 3023 where the protruding sections 3021 corresponds to can be improved to optimize uniformity.

In an embodiment, a depth of the grid dots 3022 in the region 3023 where the protruding sections 3021 correspond to is greater than other region, so that brightness of the region 3023 where the protruding sections 3021 corresponds to can be improved to optimize uniformity.

Figure 7:
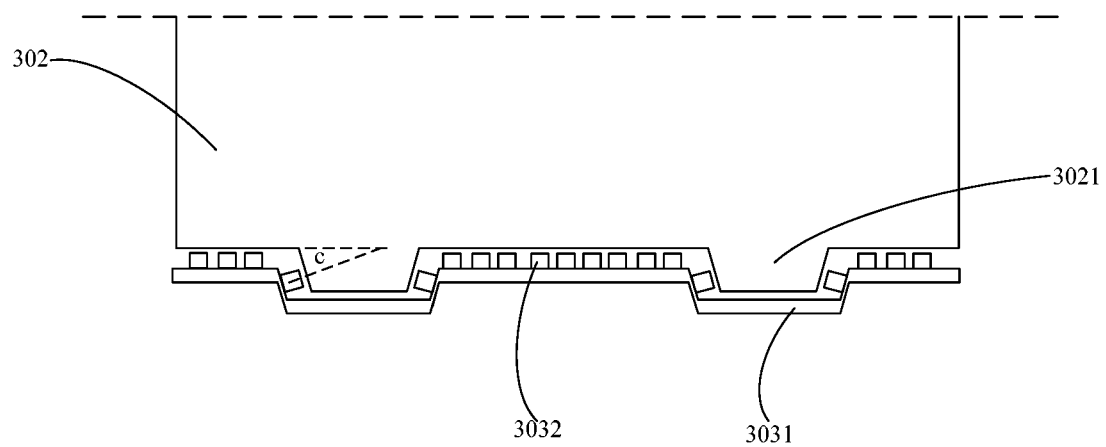
FIG. 7 is a schematic diagram of a light source module provided by an embodiment of the present disclosure.

In an embodiment, as illustrated in FIG. 7, the lateral light source 303 includes a plurality of LED lights 3032 which are spaced apart along a longitudinal direction of a circuit board 3031 (such as a flexible printed circuit board). The circuit board 3031 is divided into a vertical section and an inclined section. The vertical section and the light guide plate 302 remove a region of the protruding sections 3021. The inclined section is opposite to a first inclined surface and a second inclined surface of the protruding sections 3021. The number of the LED lights in each light source module depends on the corresponding plane width.

In an embodiment, as illustrated in FIG. 7, a third included angle c is formed between a light-exiting direction of a light source, which is close to a region of the backlight concave sections (located on the oblique section of the back plate) in the light source module and the light incident surface of the light guide plate is a sharp angle.

In an embodiment, the third included angle ranges from 0° to 45° to achieve great optical quality.

In an embodiment, the backlight module further includes an optical film disposed on a side of a light exiting surface of the light guide plate, such as a diffusion sheet, and a reflective sheet disposed on a side of the light guide plate away from the light exiting surface, which will not be described in details herein.

Figure 8:
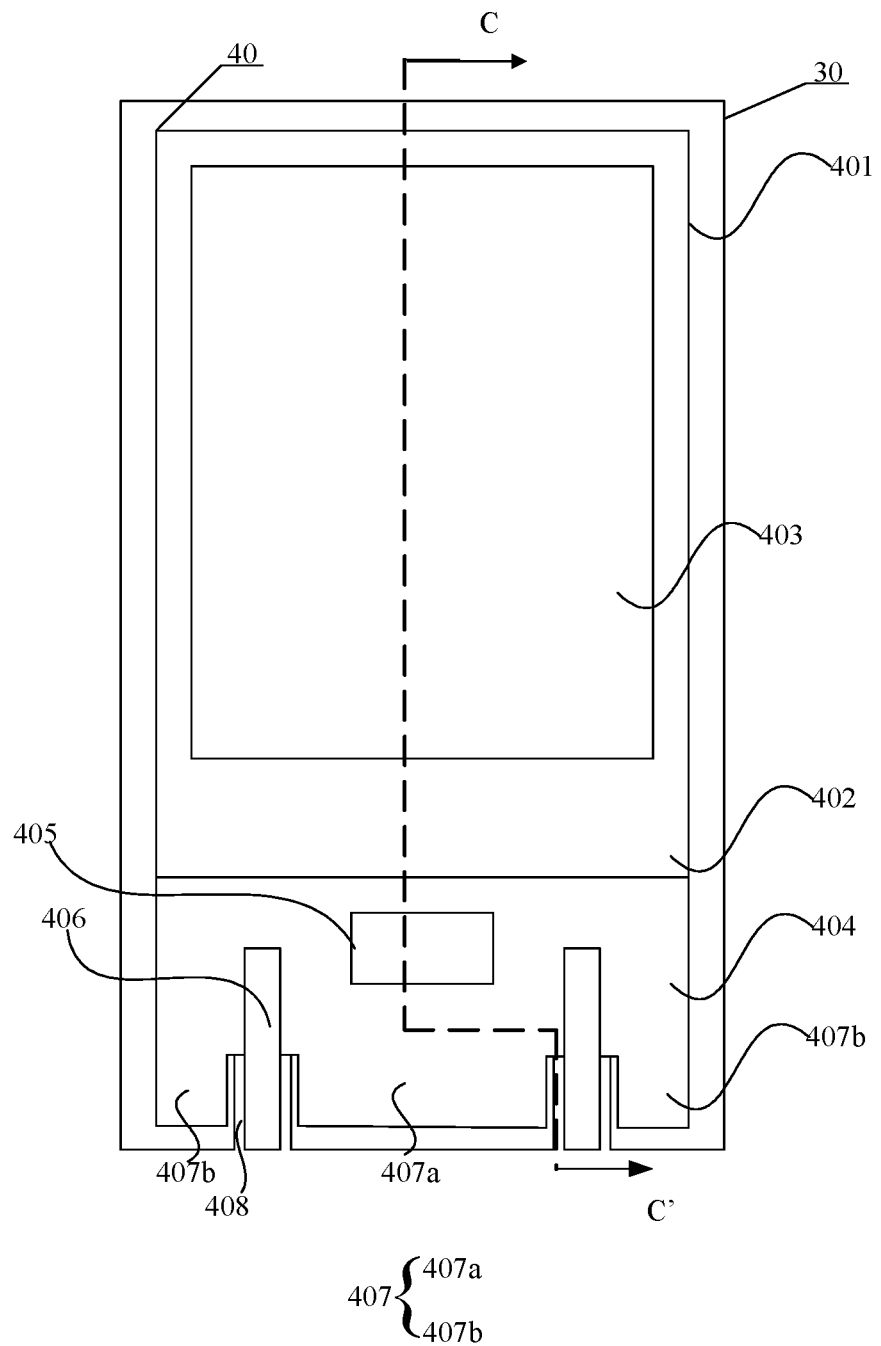
FIG. 8 is a schematic diagram of a display device provided by an embodiment of the present disclosure.
Figure 9:
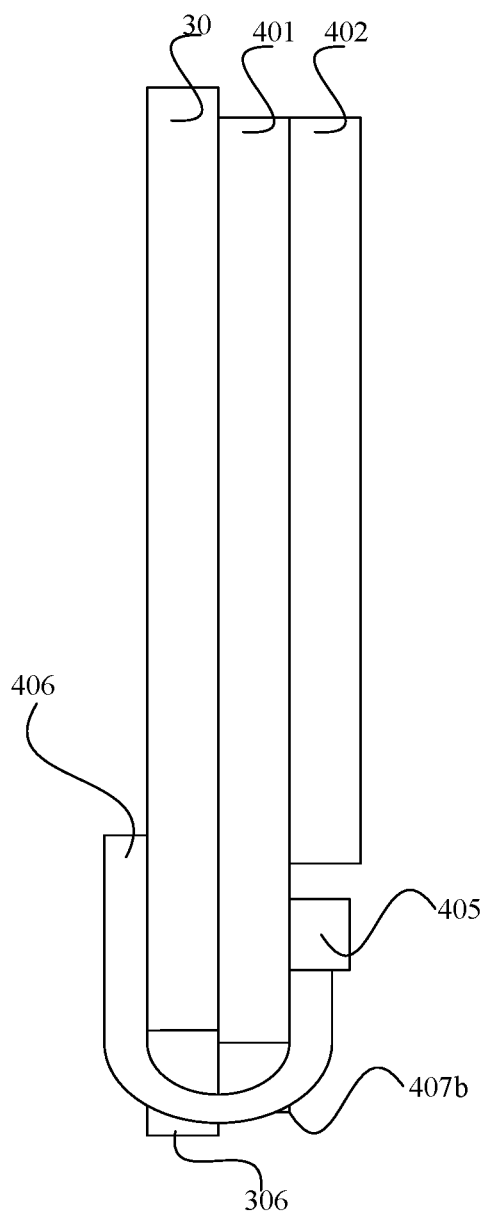
FIG. 9 is a schematic diagram of a C-C' cross section of a display device provided by an embodiment of the present disclosure.

In an embodiment, meanwhile, as illustrated in FIG. 8 and FIG. 9, the present disclosure provides a display device which includes the backlight module 30 and the display panel 40 provided by the present disclosure.

The display panel 40 includes an array substrate 401, and a color film substrate 402 disposed opposite the array substrate 401; a display region 403 defined by a surface of the array substrate 401, and the display region 403 is restricted by sealant; a liquid crystal layer is disposed in the sealant; the color film substrate 402 and the array substrate 401 is combined by the sealant.

A non-display region 404 is formed between outside the display region 403 and an edge of the array substrate 401; a signal trace is arranged in the non-display region 404, and a driving chip 405, a flexible electric circuit board 406, and other electronic elements are bonded to the non-display region 404.

The color film substrate 402 is shorter than the array substrate 401, and the color film substrate 402 is higher than the surface of the array substrate 401; a stairs region is formed in a region between a projection of a bottom edge of the color film substrate 402 on the surface of the array substrate 401 and an edge of the array substrate 401; the stairs region is located in the non-display region 404, and the driving chip 405, the flexible electric circuit board 406, and other electronic elements are located on a side of the non-display region 404, that is, located in the stairs region. The signal trace extends from the stairs region to the entire non-display region 404 and the display region 403.

When a mother board of the display panel is cut, at least two bumps 407 are reserved at one end of the array substrate 401 away from the display region 403; panel concave sections 408 are formed between the adjacent bumps 407; and the panel concave sections 408 and the backlight concave sections 304 of the backlight module are correspondingly disposed.

The flexible electric circuit board 406 includes a connection section connected to the non-display region 404, a major section bent to the back of the display panel, and a bending section connected to the connection section and the major section; part of the sections (bending section) of the flexible electric circuit board are bent to the back of the backlight module 30 through an edge of the panel concave section 408 and the backlight concave sections 304.

In an embodiment, the bumps 407 include at least one first bump 407a, and at least one second bump 407b; the first bump 407a is located in a middle position of an end of the array substrate 401; the driving chip 405 is disposed on a bottom edge of the first bump 407a, that is, between an edge of the non-display region 404 and an edge of the display region 403, thereby raising a height of the upper side of the driving chip 405 from the edge of the display region 403 and a height of the bottom side of the driving chip 405 from the edge of the non-display region 404.

In an embodiment, part of the sections (bending section) of the flexible electric circuit board are bent to the back of the backlight module 30 through the panel concave section 408 of at least a side of the bumps 407a and an edge of the backlight concave sections 304.

In an embodiment, to further optimize the effect, a bending apex of the flexible electric circuit board is located in the panel concave section 408 and the backlight concave sections 304. That is, the bending section is located in the concave region, and a bending radius of the bending section is less than or equal to the height of the first bump 407a, that is, the bending section is not extended beyond the panel concave section 408.

In this embodiment, the first bump 407a is disposed based on the number of the driving chips, and the position of the first bump 407a and the driving chip is not limited to the middle position of the non-display region. For example, the first bump 407a may also be disposed near any side of the non-display region.

In this embodiment, the second bump 407b is disposed based on the number of the first bump 407a for increasing the contact area of the bumps 407 with the housing of the display device, so that the stress on the display panel is uniform. The second bump 407b and the first bump 407a are not limited to the staggered arrangement configuration.

In embodiments of the present disclosure, the second bump 407b may only have a supporting function, and no circuit elements is disposed in its region, and it may also be used as a configuration area of circuit elements; the circuit elements may be the circuit elements required by the display panel, such as a conversion terminal, and it may also be a circuit element such as a fingerprint recognition element and cameras which are not required by display panels.

Therefore, compared with the display panels of prior art, embodiments of the present disclosure widen the space on the upper and bottom sides of the driving chip 405, and does not increase the overall height of the non-display region 404, thereby not only solving the problem concerning the space around the driving chip 405, but also maintaining the narrow non-display region of display panels of prior art.

Figure 10:
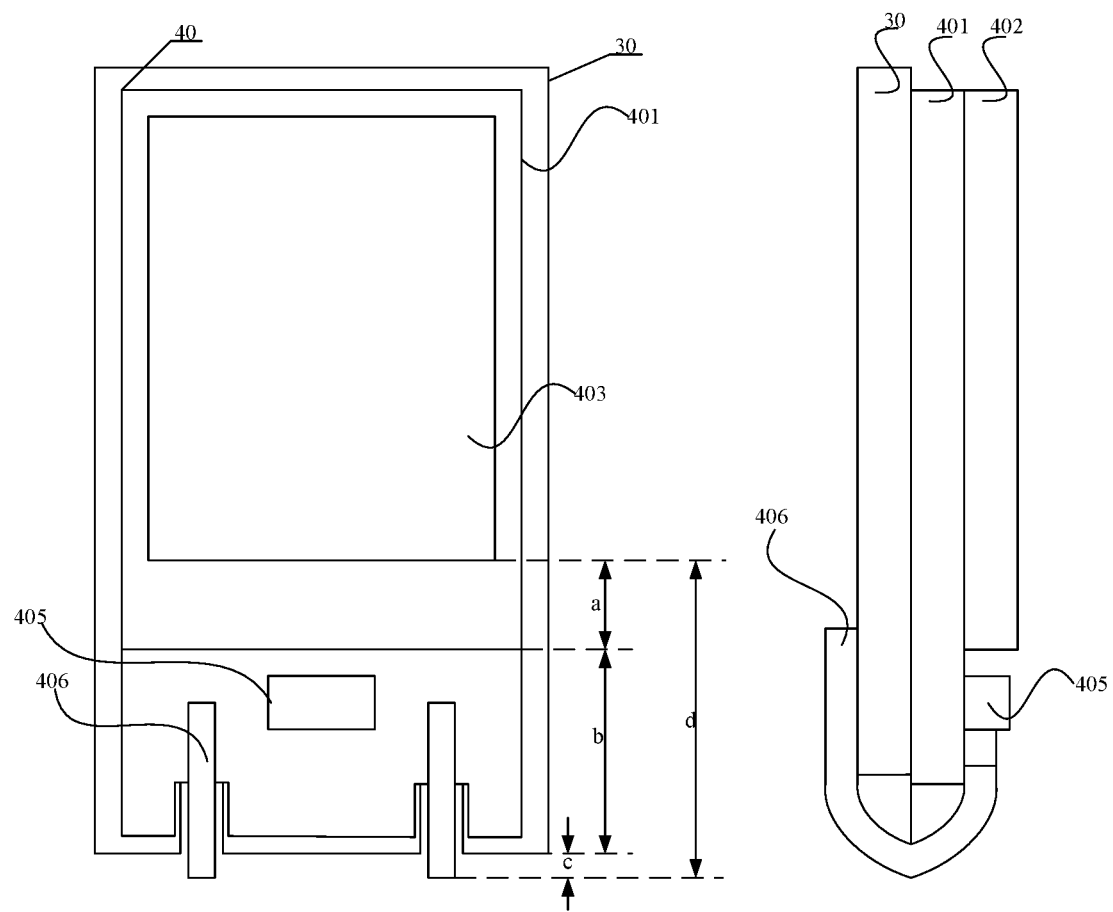
FIG. 10 is a dimension schematic diagram of a display device provided by an embodiment of the present disclosure.

Corresponding to FIG. 2, and as illustrated in FIG. 10, a height d of the bottom non-display region of the display device is the distance from the display region 403 to the bottom edge of the display device, that is, a sum of a distance a between the display region 403 and a visible region of the backlight module 30, a distance b between the visible region of the backlight module 30 and a bottom edge of the backlight module 30, and a distance c between the bottom edge 3 of the backlight module 30 and the bottom edge of the display device, which is d=a+b+c. At this time, the bending apex of the flexible electric circuit board 406 is located outside the panel concave section and the backlight concave sections.

In an embodiment, the bending apex of the flexible electric circuit board 406 is located in the panel concave section 408 and the backlight concave sections 304. Therefore, the value of the distance c between the edge of the backlight module 30 and the edge of the display device can be reduced compared to a value of c in the display devices of prior art (value of c can be 0). At this time, the height d of the bottom non-display region of the display device is the distance from the display region 403 to the bottom edge of the display device, that is, a sum of the distance a between the display region 403 and a visible region of the backlight module 30, and the distance b between the visible region of the backlight module 30 and a bottom edge of the backlight module 30, which is d=a+b. Therefore, the size of the bottom non-display region of the display device in the embodiment of the present disclosure is reduced relative to the bottom non-display region of the display devices of prior art, thereby further realizing a narrow non-display region and a high screen-to-body ratio.

The panel concave section 408 and the backlight concave sections 304 of the backlight module are correspondingly disposed. Generally, an orthographic projection of the backlight concave sections 304 on the backlight module 30 covers an orthographic projection of the panel concave section 408 on the backlight module 30 to protect the display panel 40. A shape of the backlight concave sections 304 is the same as a shape of the panel concave section 408, and can be different from each other.

In an embodiment, a shape of the backlight concave sections 304 and the panel concave section 408 is a trapezoidal shape, which can make a density of the lateral light source placed in the light source placement region greater to enhance display effect of the display device.

In an embodiment, for reserving sufficient space to arrange the gate on array (GOA) trace, a fan-out trace, and terminals, a distance between a side of the driving chip close to the display region and an edge of the display region is configured to be larger than a distance between a side of the driving chip close to the first bump and an edge of the first bump.

For example, the driving chip is located in the non-display region and out of the first bump.

For another example, the driving chip is completely or partially disposed in the first bump.

In an embodiment, a shape of the bumps 407 can be a varied shape.

Figure 11:
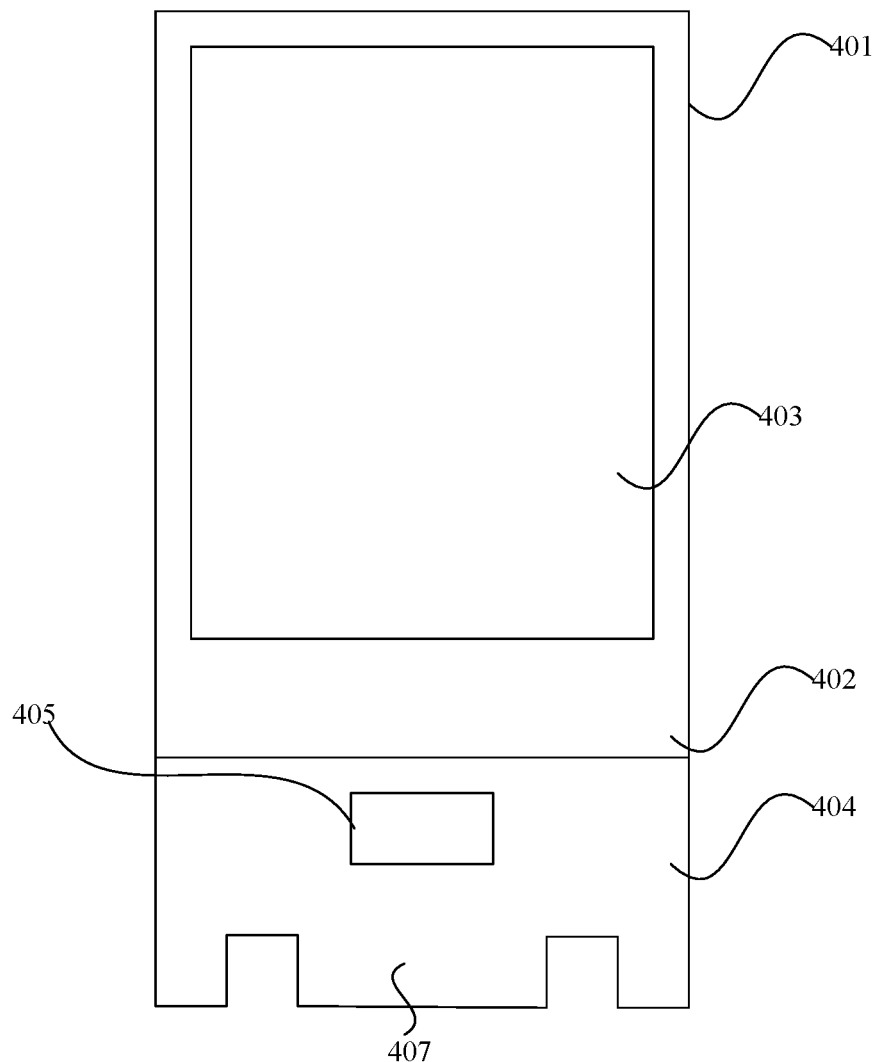
FIG. 11 is a schematic diagram of a first type bump of a display device provided by an embodiment of the present disclosure.

In an embodiment, as illustrated in FIG. 11, the display panel provided by the present disclosure includes an array substrate 401, a color film substrate 402, a display region 403, and bumps 407 formed on an end of the array substrate 401. A driving chip 405 is disposed in the non-display region 404 of the array substrate 401.

The bumps 407 include two short edges disposed symmetrically, which are connected to an edge of the non-display region 404, and a long edge connected to the two short edges; for example, as illustrated in FIG. 11, the short edges are straight edges, and the short edges are perpendicular to the edge of the non-display region 404. At this time, a surface shape of the bumps 407 is a rectangular shape.

Figure 12:
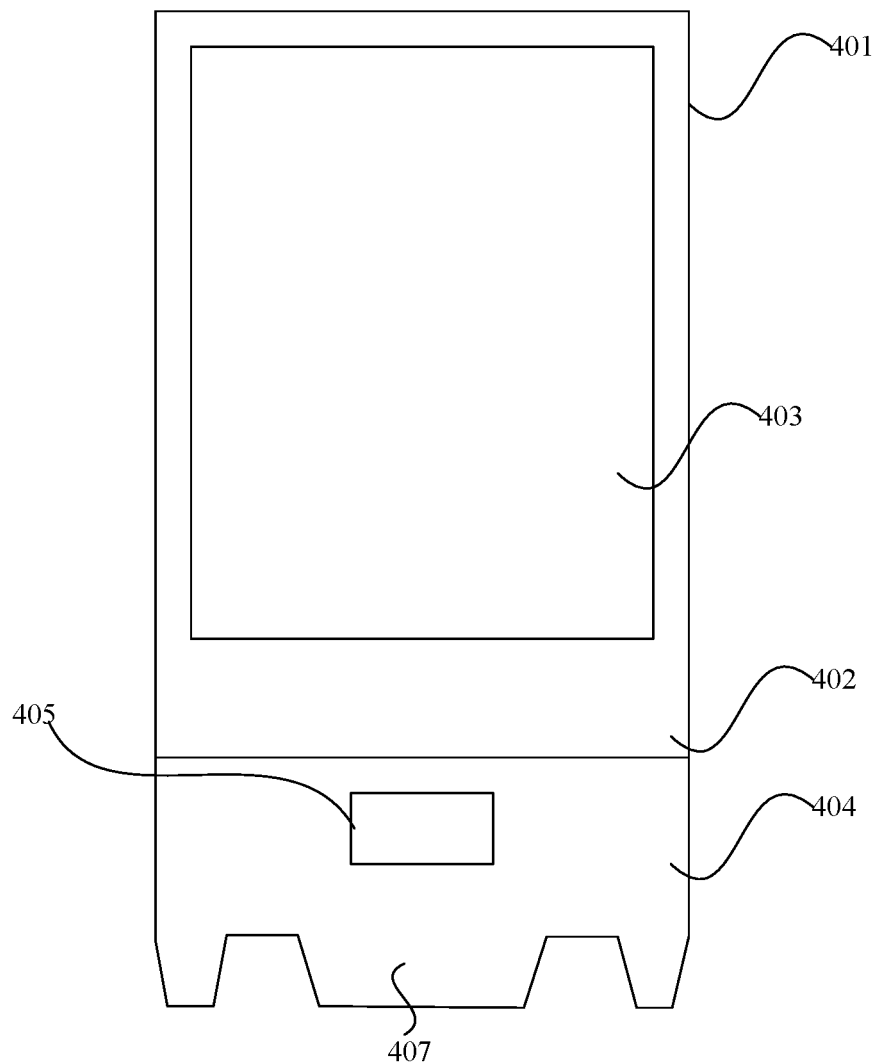
FIG. 12 is a schematic diagram of a second type bump of a display device provided by an embodiment of the present disclosure.

In an embodiment, the bumps 407 include two short edges disposed symmetrically, which are connected to an edge of the non-display region 404, and a long edge connected to the two short edges; as illustrated in FIG. 12, the differences between the display panel in this embodiment and FIG. 11 include the short edges are straight edges, and an included angle formed between the short edges and the edge of the non-display region 404 is not a right angle, that is the included angle is greater than or less than 90 degrees, and a surface shape of the bumps 407 is a trapezoidal shape.

Figure 13:
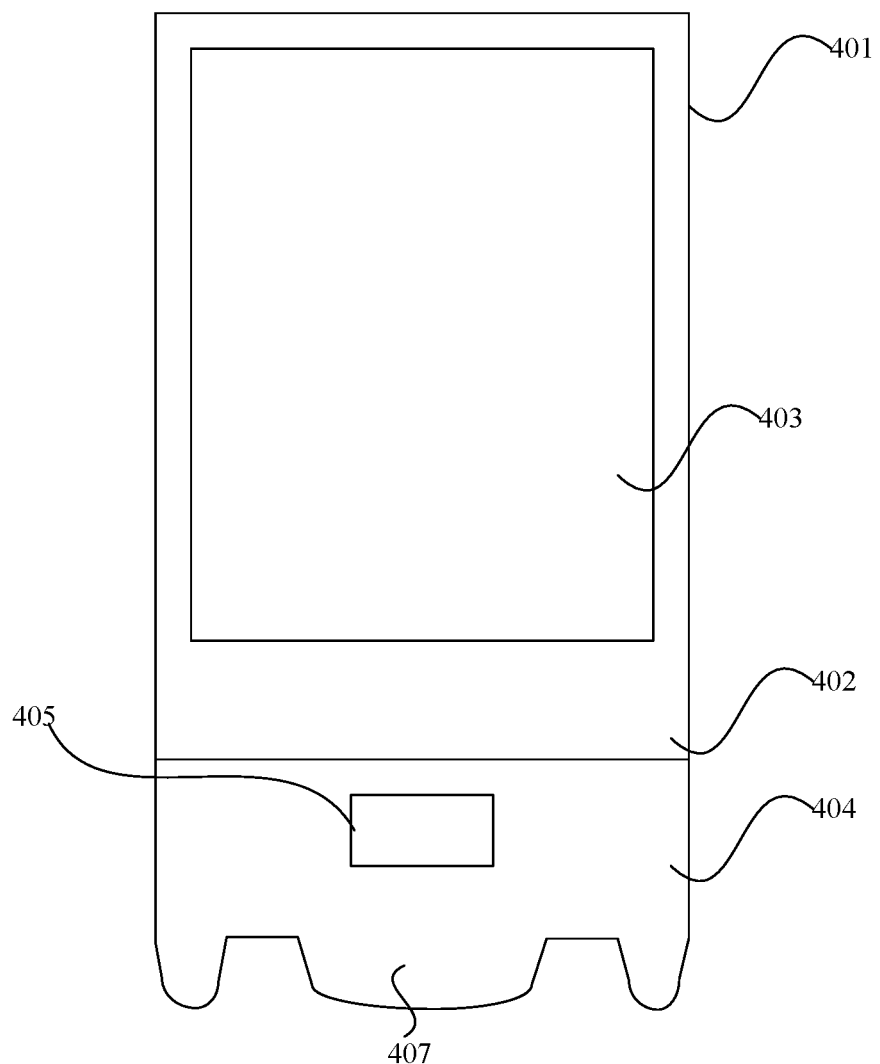
FIG. 13 is a schematic diagram of a third type bump of a display device provided by an embodiment of the present disclosure.

In an embodiment, as illustrated in FIG. 13, the differences between the display panel provided by this embodiment and FIG. 11, FIG. 12 include the bumps 407 include an outer circular arc edge, two ends of the outer circular arc edge are connected to the edge of the non-display region 404, and the ends of the outer circular arc has an inner arc transition.

The terminal setting method of the flexible electric circuit board will now be described.

Figure 14:
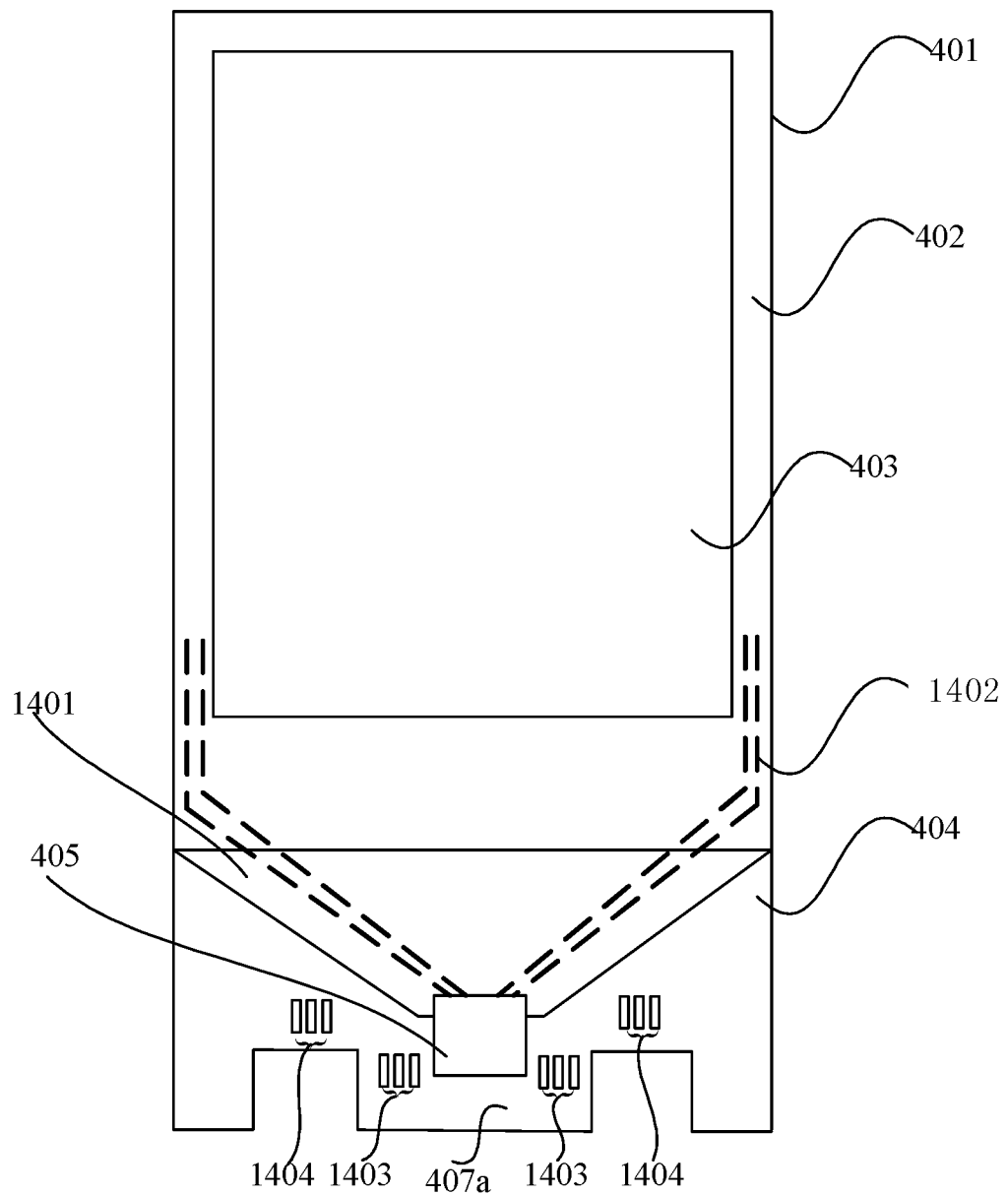
FIG. 14 is a schematic diagram of a configuration of a first type terminal of a display device provided by an embodiment of the present disclosure.

As illustrated in FIG. 14, the display panel provided by the present disclosure includes an array substrate 401, a color film substrate 402, a non-display region 404 located in non-display area of the array substrate 401, a driving chip disposed in the non-display region 404, and a fan-out trace 1401 connected to the driving chip 405, for example, the fan-out trace 1401 is for transmitting a display data signal into the display region 403; at least a set of a GOA trace 1402 (gate driving circuit) is disposed in the non-display region 404. Take two sets of the GOA trace 1402 as an example for describing, the two sets of the GOA trace 1402 include a parallel section located outside the display region 403 and parallel to an edge of the display region 403, and an oblique section located in the non-display region 404 and directed to the driving chip 405. The oblique section of the GOA trace 1402 is connected to the driving chip 405 to input a gate signal, and the parallel section of the GOA trace 1402 is connected to scan lines of each pixel row to output the gate signal.

A plurality of signal terminal groups is disposed inside the non-display region 404 for connecting to the flexible electric circuit board. The signal terminal group at least includes a major signal terminal set 1403 and a sub signal terminal set 1404. For example, the major signal terminal set 1403 includes a pixel data signal and a gate signal, and the sub signal terminal set 1404 includes a power source signal, etc.; the major signal terminal set 1403 is located between the sub signal terminal set 1404 and the driving chip 405 to reduce delay of data transmission.

In an embodiment, as illustrated in FIG. 14, the major signal terminal set 1403 is disposed close to the driving chip 405; the sub signal terminal set 1404 is disposed away from the driving chip 405 and the oblique section of the GOA trace 1402. Because the driving chip 405 is relatively moved downward, the oblique section of the GOA trace 1402 connected to the driving chip 405 is simultaneously moved downward, thereby compressing the configuration space of the terminal. If the terminal is too close to the GOA trace 1402, the impedance will increase, distorting the signal and affecting the display quality. Therefore, embodiments of the present disclosure dispose at least part of the terminals away from the GOA trace 1402.

In an embodiment, the sub signal terminal set 1404 and the major signal terminal set 1403 are spaced apart, and the major signal terminal is completely or partially located in the first bump 407a, the sub signal terminal is located out of the bumps 407. Thereby, the distance between the terminals and the GOA trace 1402 is effectively controlled to reduce the impedance.

Figure 15:
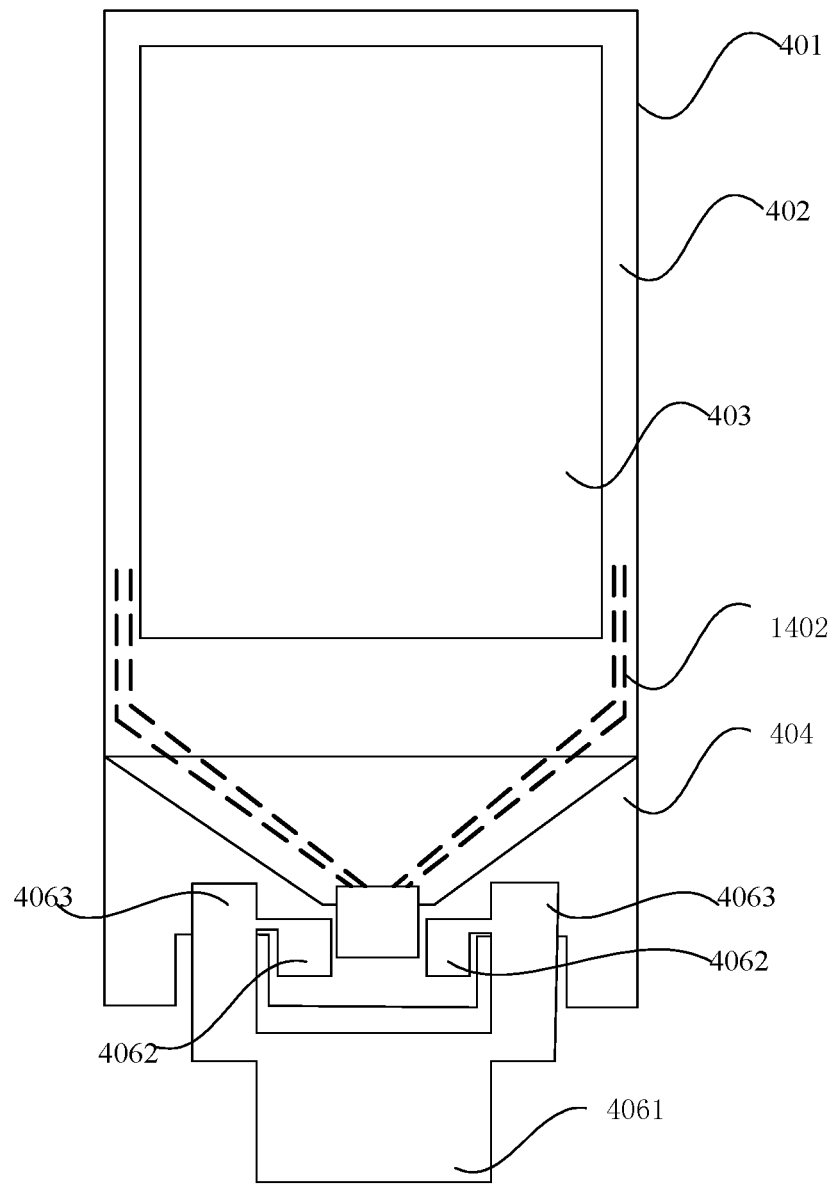
FIG. 15 is a schematic diagram of a first type flexible electric circuit board of a display device provided by an embodiment of the present disclosure.

As illustrated in FIG. 15, the flexible electric circuit board includes a major section 4061 and a connection section for connecting the signal terminal groups; the connection section includes a first block 4062 correspondingly connected to the major signal terminal set 1403, and a second block 4063 correspondingly connected to the sub signal terminal set 1404; the first block 4062 and the second block 4063 are disposed in stagger.

Figure 16:
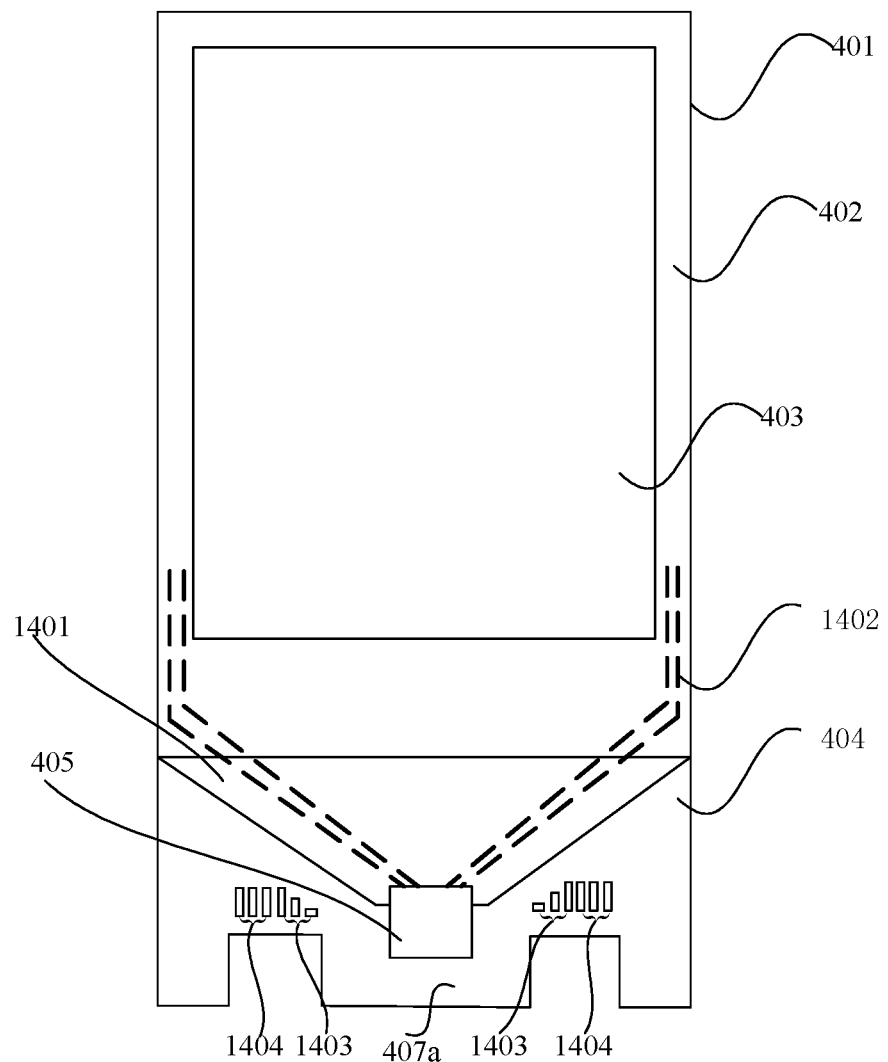
FIG. 16 is a schematic diagram of a configuration of a second type terminal of a display device provided by an embodiment of the present disclosure.

As illustrated in FIG. 16, compared with the signal terminal arrangement configuration of FIG. 14, the terminals are closely arranged, and the major signal terminal set 1403 and the sub signal terminal set 1404 are both disposed outside the first bump 407a, thereby preventing compressing the space of the first bump 407a; and the area of each terminal in the major signal terminal set 1403 is equivalent to the area of each terminal of the sub signal terminal set 1404 to ensure a stable connection of signal contact points.

In an embodiment, the height of each terminal of the major signal terminal set is less than the height of each terminal of the sub signal terminal set, and the width of each terminal of the major signal terminal set is wider than the width of each terminal of the sub signal terminal set; by reducing the height of the terminals close to the GOA trace 1402 to maintain the distance between the GOA trace 1402, thereby reducing the impedance generated between the terminals and the GOA trace 1402.

In an embodiment, the height of each terminal in the major signal terminal set 1403 is decreasing from the terminal of the oblique section away from the driving chip 405 and the GOA trace 1402 to the terminal of the oblique section close to the driving chip 405 and the GOA trace 1402; further, the width of each of the terminals in the major signal terminal set 1404 is increasing from the terminal of the oblique section away from the driving chip 405 and the GOA trace 1402 to the terminal of the oblique section close to the driving chip 405 and the GOA trace 1402, thereby ensuring the distance between each terminal and the GOA trace 1402 is equal.

Figure 17:
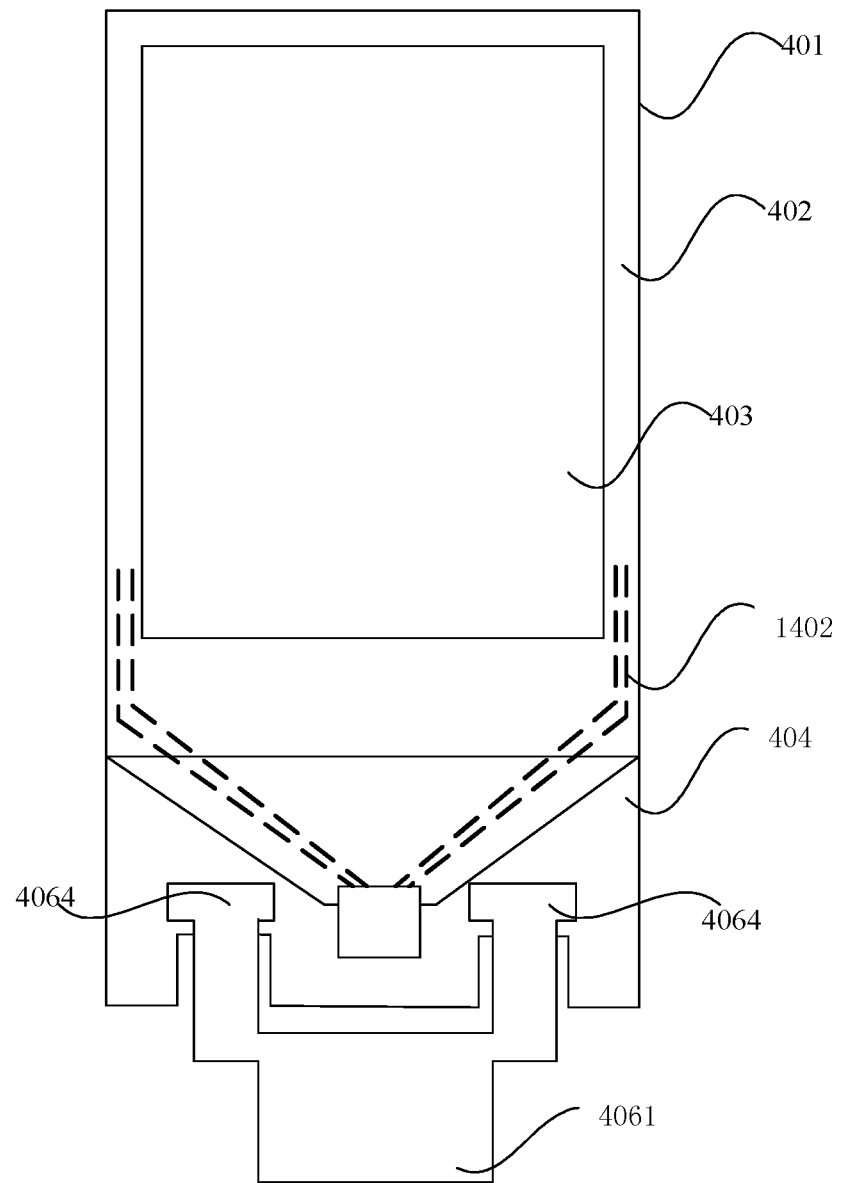
FIG. 17 is a schematic diagram of a second type flexible electric circuit board of a display device provided by an embodiment of the present disclosure.

As illustrated in FIG. 17, the flexible electric circuit board includes a major section 4061 and a connection section 4064 for connecting the terminals; the end of the connection section 4064 is a regular polygon; a first connection region and a second connection region are disposed on the connecting section 4064; the first connection region covers and connects to the major signal terminal set, and the second connection region covers and connects to the sub signal terminal set.

In an embodiment, a virtual terminal group is disposed in the non-display region 405, and the virtual terminal group is located on a side of the sub signal terminal set away from the driving chip and the oblique section of the GOA trace. The virtual terminal group can support the flexible electric circuit board to ensure the flatness of the display panel.

The circuit configuration on the second bump will now be described.

Figure 18:
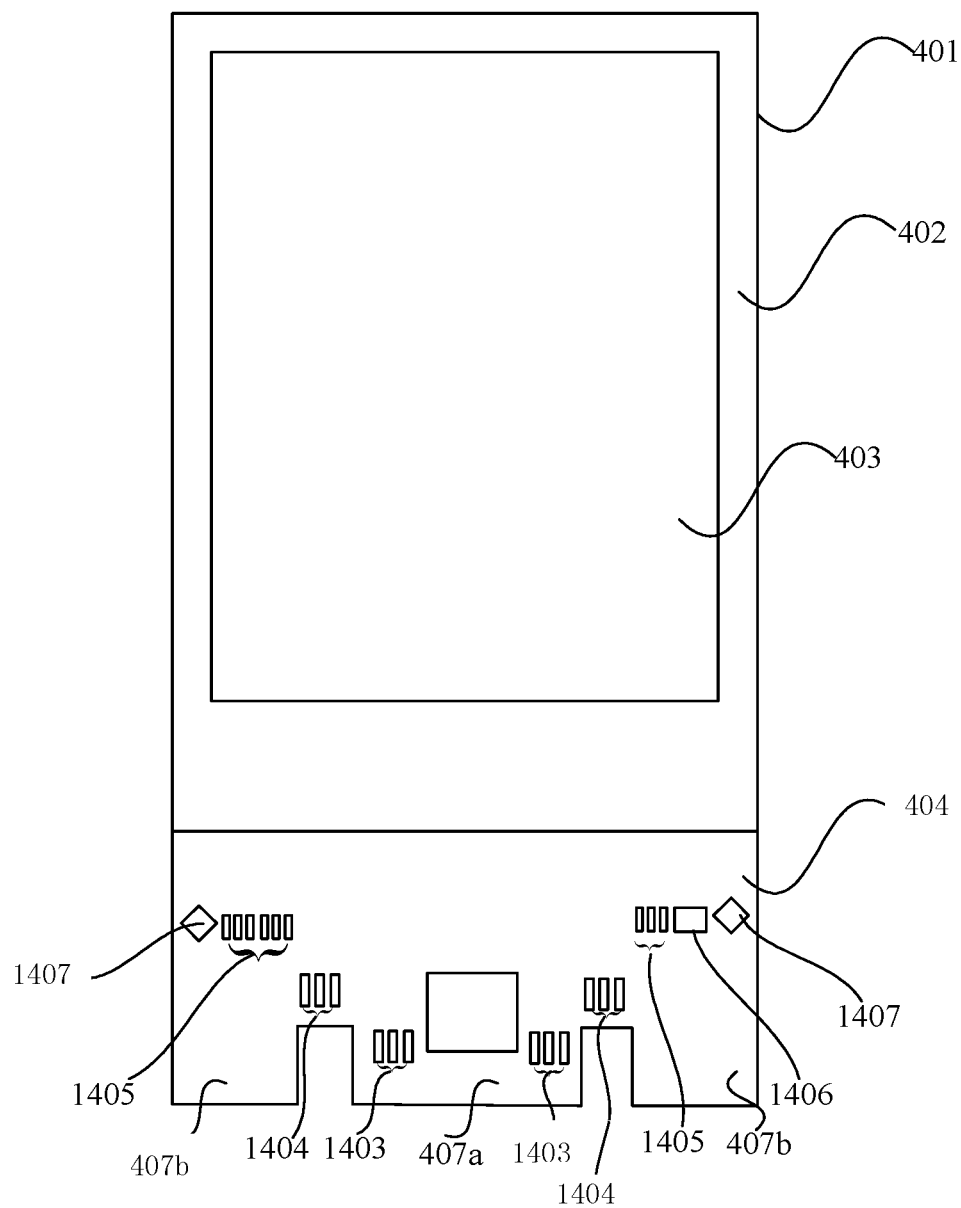
FIG. 18 is a schematic diagram of a configuration of a third type terminal of a display device provided by an embodiment of the present disclosure.

In an embodiment, as illustrated in FIG. 18, the display panel provided by the present disclosure includes an array substrate 401, a color film substrate 402, a non-display region 404 located in non-display area of the array substrate 401, and a testing terminal group 1405, a conversion terminal group 1406, and a recognition terminal group 1407 disposed in the non-display region 404. At least one of the testing terminal group 1405, the conversion terminal group 1406, and the recognition terminal group 1407 is located between an edge of the second bump 407b and an edge of the display region 403.

Terminals of the testing terminal group 1405, the conversion terminal group 1406, and the recognition terminal group 1407 can be disposed in a same row between an edge of the second bump 407b and an edge of the display region 403, and can be disposed in a plurality of rows between an edge of the second bump 407b and an edge of the display region 403.

Figure 19:
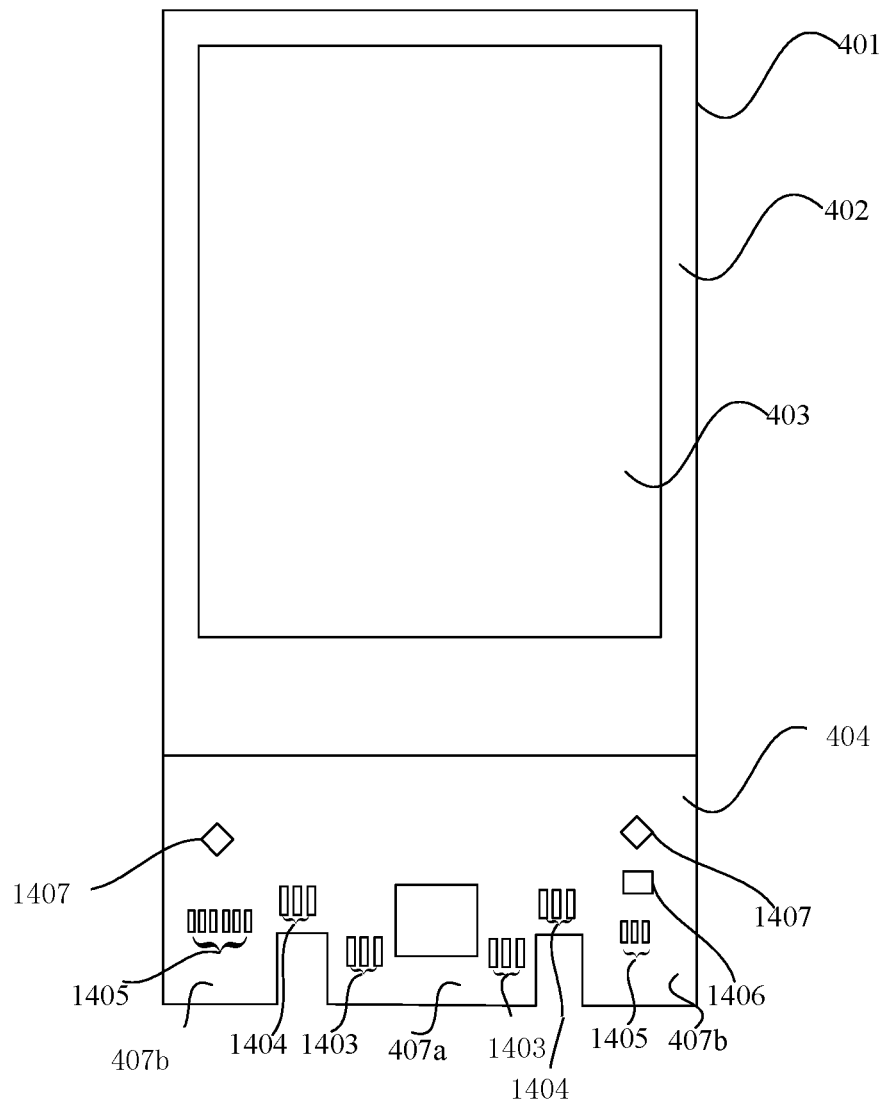
FIG. 19 is a schematic diagram of a configuration of a fourth type terminal of a display device provided by an embodiment of the present disclosure.

In an embodiment, for increasing a gap between the testing terminal group 1405, the conversion terminal group 1406, and the recognition terminal group 1407, as illustrated in FIG. 19, in the display panel provided by the present disclosure, the testing terminal group 1405, the conversion terminal group 1406, and the recognition terminal group 1407 are disposed in at least two rows.

The terminals in the test terminal group 1405 are used for the performance test of the display panel by inputting a test signal to the terminals in the test terminal group 1405 after the array substrate is prepared into a display panel. The terminals in the conversion terminal group 1406 are used for coating conductive silver paste, and the conductive silver paste is used for connecting a ground line (not shown) in the non-display region 401 of the array substrate and a conductive layer of the color filter substrate disposed opposite the array substrate in the display panel to achieve anti-static effect. The terminals in the recognition terminal group 1407 are used to record information about the array substrate, as well as for alignment and the like.

According to embodiments mentioned above:

The present disclosure provides a backlight module and a display device. By disposing the backlight concave sections on the light source lateral side of the back frame in the backlight module, the backlight concave sections and the panel concave section on the display panel correspond to each other. During assembling, part of sections of the flexible electric circuit board bent to the back of the backlight module through an edge of the panel concave section and the backlight concave sections to reduce a size of the bottom bezel of the display device, which improves the screen-to-body ratio of the display device, enhances the differentiated performance of the product, and improves market competitiveness of the product.

In summary, although the present disclosure has disclosed the preferred embodiments as above, however the above-mentioned preferred embodiments are not to limit to the present disclosure. A person skilled in the art can make any change and modification, therefore, the scope of protection of the present disclosure is subject to the scope defined by the claims.

What is claimed is:

1. A backlight module, comprising:
  a back frame comprising a light source lateral side for disposing a lateral light source, and a confining lateral side; and the light source lateral side and the confining lateral side surrounding to form an accommodating chamber;
  a light guide plate disposed in the accommodating chamber, and a light incident surface of the light guide plate corresponding to the light source lateral side;
  the lateral light source disposed between the light source lateral side and the light guide plate;
  wherein at least two backlight concave sections are formed on the light source lateral side,
  wherein the backlight module is disposed corresponding to a display panel, and
  wherein the display panel comprises an array substrate, a driving chip, and a flexible electric circuit board; the array substrate comprises a display region and a non-display region; the driving chip and the flexible electric circuit board are bonded on a side of the non-display region; at least two bumps are formed on a side of the non-display region away from the display region; a panel concave section is formed between the adjacent bumps; the panel concave sections correspond to the backlight concave sections of the backlight module; and part of sections of the flexible electric circuit board is bent to back of the backlight module through an edge of the panel concave section and the backlight concave sections.

2. The backlight module as claimed in claim 1, wherein a width of the backlight concave sections is 1% to 50% of a width of the back frame.

3. The backlight module as claimed in claim 1, wherein a plurality of protruding sections are disposed on an edge of the light guide plate close to the backlight concave sections, and a location where the protruding sections disposed corresponds to the backlight concave sections.

4. The backlight module as claimed in claim 3, wherein the protruding sections comprise an edge, and a first oblique surface and a second oblique surface which are connected to two ends of the edge; a first included angle formed between the first oblique surface and the light incident surface of the light guide plate is a non-sharp angle; a second included angle formed between the second oblique surface and the light incident surface of the light guide plate is a non-sharp angle.

5. The backlight module as claimed in claim 4, wherein the edge of the protruding sections is a straight-line shape or a circular shape.

6. The backlight module as claimed in claim 3, wherein a plurality of grid dots are disposed on the light guide plate, a density of the grid dots in a region where the protruding sections correspond to is greater than other region.

7. The backlight module as claimed in claim 1, wherein the back frame comprises a plastic frame, or a plastic-iron integrated frame.

8. The backlight module as claimed in claim 1, wherein at least two of the backlight concave sections separate the light source lateral side into at least three bulge sections, and the lateral light source comprises a light source module located in and/or on the bulge sections.

9. The backlight module as claimed in claim 8, wherein a third included angle formed between a light-exiting direction of a light source which is close to a region of the backlight concave sections in the light source module and the light incident surface of the light guide plate is a sharp angle.

10. The backlight module as claimed in claim 9, wherein the third included angle ranges from 0 degree to 45 degrees.

11. A display device, comprising a backlight module and a display panel; wherein the backlight module comprises:
  a back frame comprising a light source lateral side for disposing a lateral light source, and a confining lateral side; and the light source lateral side and the confining lateral side surrounding to form an accommodating chamber;
  a light guide plate disposed in the accommodating chamber, and a light incident surface of the light guide plate corresponding to the light source lateral side;
  the lateral light source disposed between the light source lateral side and the light guide plate, wherein at least two backlight concave sections are formed on the light source lateral side; and
  wherein the display panel comprises an array substrate, a driving chip, and a flexible electric circuit board; the array substrate comprises a display region and a non-display region; the driving chip and the flexible electric circuit board are bonded on a side of the non-display region; at least two bumps are formed on a side of the non-display region away from the display region; a panel concave section is formed between the adjacent bumps; the panel concave sections correspond to the backlight concave sections of the backlight module; and part of sections of the flexible electric circuit board is bent to back of the backlight module through an edge of the panel concave section and the backlight concave sections.

12. The display device as claimed in claim 11, wherein a bending apex of the flexible electric circuit board is located in the panel concave section and the backlight concave sections.

13. The display device as claimed in claim 11, wherein the bumps comprise at least one first bump, and at least one second bump, and the driving chip is located between an edge of the first bump and an edge of the display region.

14. The display device as claimed in claim 13, wherein the driving chip is located out of the first bump; or the driving chip is completely or partially disposed in the first bump.

15. The display device as claimed in claim 12, wherein a shape of the bumps comprises one or several of a rectangular shape, a trapezoidal shape, a circular arc shape, or a triangular shape.

16. The display device as claimed in claim 12, wherein a gate on array (GOA) trace is disposed inside the array substrate, and the GOA trace comprises an oblique section located in the non-display region and directed to the driving chip, the oblique section of the GOA trace is connected to the driving chip; a plurality of signal terminal groups is disposed inside the non-display region for connecting to the flexible electric circuit board.

17. The display device as claimed in claim 16, wherein the signal terminal group comprises a major signal terminal set and a sub signal terminal set; the major signal terminal set is located between the sub signal terminal set and the driving chip.

18. The display device as claimed in claim 17, wherein the sub signal terminal set and the major signal terminal set are spaced apart, and the major signal terminal set is completely or partially located in the first bump, the sub signal terminal set is located out of the first bump.

19. The display device as claimed in claim 18, wherein the flexible electric circuit board comprises a major section and a connection section, the connection section comprises a first block correspondingly connected to the major signal terminal set, and a second block correspondingly connected to the sub signal terminal set, and the first block and the second block are disposed in stagger.

20. The display device as claimed in claim 17, wherein the signal terminal group further comprises a virtual terminal group, the virtual terminal group is located on a side of the sub signal terminal set away from the driving chip and the oblique section of the GOA trace.

* * * * *